(12) United States Patent
Byeon

(10) Patent No.: US 9,490,032 B2
(45) Date of Patent: Nov. 8, 2016

(54) INTEGRATED CIRCUIT CHIP AND MULTI-CHIP SYSTEM INCLUDING THE SAME

(71) Applicant: SK hynix Inc., Gyeonggi-do (KR)

(72) Inventor: Sang-Jin Byeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 365 days.

(21) Appl. No.: 14/062,437

(22) Filed: Oct. 24, 2013

(65) Prior Publication Data

US 2014/0354311 A1 Dec. 4, 2014

(30) Foreign Application Priority Data

May 28, 2013 (KR) .................... 10-2013-0060307

(51) Int. Cl.
  *G11C 29/26* (2006.01)
  *G01R 31/3185* (2006.01)

(52) U.S. Cl.
  CPC ....... *G11C 29/26* (2013.01); *G01R 31/318505* (2013.01); *G11C 2029/2602* (2013.01)

(58) Field of Classification Search
  CPC .......... G11C 29/26; G11C 2029/2602; G01R 31/318505
  USPC ..................................................... 324/750.3
  See application file for complete search history.

(56) References Cited

U.S. PATENT DOCUMENTS

| 6,252,805 | B1* | 6/2001 | So ......................... G11C 29/38 365/189.07 |
| 6,587,470 | B1* | 7/2003 | Elliot ..................... H04J 3/1611 370/404 |
| 7,969,193 | B1* | 6/2011 | Wu ...................... H01L 25/0657 257/758 |
| 7,971,117 | B2 | 6/2011 | Lee et al. |
| 2006/0267212 | A1* | 11/2006 | Shibata ................. H01L 23/544 257/777 |
| 2009/0039915 | A1* | 2/2009 | Ruckerbauer ............ G11C 5/02 326/38 |
| 2010/0095168 | A1* | 4/2010 | Jeddeloh .................. G11C 5/02 714/720 |
| 2011/0084722 | A1* | 4/2011 | Nishioka ................... G11C 5/02 324/762.01 |
| 2011/0309359 | A1* | 12/2011 | Saen .............. G01R 31/318513 257/48 |
| 2012/0092943 | A1* | 4/2012 | Nishioka ................ G11C 16/20 365/191 |

FOREIGN PATENT DOCUMENTS

KR    1020110039205    4/2011

* cited by examiner

*Primary Examiner* — Jermele M Hollington
*Assistant Examiner* — Khristopher Yodichkas
(74) *Attorney, Agent, or Firm* — IP & T Group LLP

(57) ABSTRACT

An integrated circuit chip includes a test circuit suitable for performing a test operation and generating a test result signal indicating whether there is an error or not in the integrated circuit chip, a transmitting unit suitable for transmitting the test result signal through an interlayer channel. The interlayer channel is precharged to a first level before the transmitting unit transmits the test result signal, and the interlayer channel is driven to a second level when there is an error.

5 Claims, 5 Drawing Sheets

US 9,490,032 B2

INTEGRATED CIRCUIT CHIP AND MULTI-CHIP SYSTEM INCLUDING THE SAME

CROSS-REFERENCE TO RELATED APPLICATIONS

The present application claims priority of Korean Patent Application No. 10-2013-0060307, filed on May 28, 2013, which is incorporated herein by reference in its entirety.

BACKGROUND

1. Field

Exemplary embodiments of the present invention relate to an integrated circuit chip and a multi-chip system including the same, and more particularly, to a technique for facilitating a test of a multi-chip system.

2. Description of the Related Art

When a memory device, for example, Dynamic Random Access Memory (DRAM), Resistive Random Access Memory (RRAM), Phase-change Random Access Memory (PRAM), Ferroelectric Random Access Memory (FRAM), Magnetic Random Access Memory (MRAM), and Flash memory, is completely fabricated, a test must be performed to check whether the memory device normally operates or not. In the test of the memory device, not only reliability of the test but also high speed of the test in several tens of millions of cells may be important. In particular, since development period of a memory device and test time of the memory device required until shipment have a direct effect on a fabrication cost, the reduction in test time emerges as an important issue in productivity and competition between makers. As a method for reducing a test time, a compression test (parallel test) may be used. The compression test is performed as follows. First, the same data are written to a plurality of cells, and then read through the use of an exclusive OR gate and the like. When the same data are read from the plurality of cells, a pass is determined and indicated as '1', and when any one different data is read from the plurality of cells, a fail is determined and indicated as '0'.

In order to increase the integration degree of a memory, a three-dimensional (3D) structure including a plurality of memory chips stacked therein has started to be applied instead of an existing two-dimensional (2D) structure. As memories with a high integration degree and a high capacity are needed, a 3D stacked structure of a memory chip may be used to increase a capacity and reduce a semiconductor chip size, thereby improving the integration degree. As the 3D structure, a through-silicon via (TSV) structure may be applied. The TSV structure is considered as an alternative for overcoming the reduction of transmission speed depending on a distance from a controller on a module, the vulnerability of data bandwidth, and the reduction of transmission speed depending on variables on a package. The TSV structure includes a path formed through a plurality of memory chips and an electrode formed in the path, in order to perform communication between stacked chips.

When the compression test (parallel test) is performed in a 3D memory system including a plurality of memory chips stacked therein, it may be an important issue to use which method to facilitate the compression test.

SUMMARY

Various exemplary embodiments are directed to a technique for testing a multi-chip system including a plurality of memory chips or integrated circuit chips stacked therein.

In accordance with an exemplary embodiment of the present invention, an integrated circuit chip includes a test circuit suitable for performing a test operation and generating a test result signal indicating whether there is an error or not in the integrated circuit chip, and a transmitting unit suitable for transmitting the test result signal through an interlayer channel, wherein the interlayer channel is precharged to a first level before the transmitting unit transmits the test result signal, and the interlayer channel is driven to a second level when there is an error.

In accordance with an exemplary embodiment of the present invention, a multi-chip system includes a number of chips, and an interlayer channel shared by the plurality of chips. Each of the chips includes a test circuit suitable for performing a test operation of the corresponding chip and generating a test result signal indicating whether there is an error or not in the corresponding chip, and a transmitting unit suitable for driving the interlayer channel to a second level when there is an error, and the interlayer channel is precharged to a first level before the transmitting units of the numbers of chips transmit the test result signals.

In accordance with an exemplary embodiment of the present invention, a multi-chip system includes a plurality of memory chips and a plurality of interlayer channels. Each of the memory chips to includes a test circuit suitable for compressing multi-bit read data and generating one-bit or more compressed data, and having a compression rate which is changed according to the number of memory chips, and a channel distribution circuit suitable for distributing an interlayer channel, through which the compressed data of the test circuit is to be transferred, among the plurality of interlayer channels.

DETAILED DESCRIPTION

Figure 1:
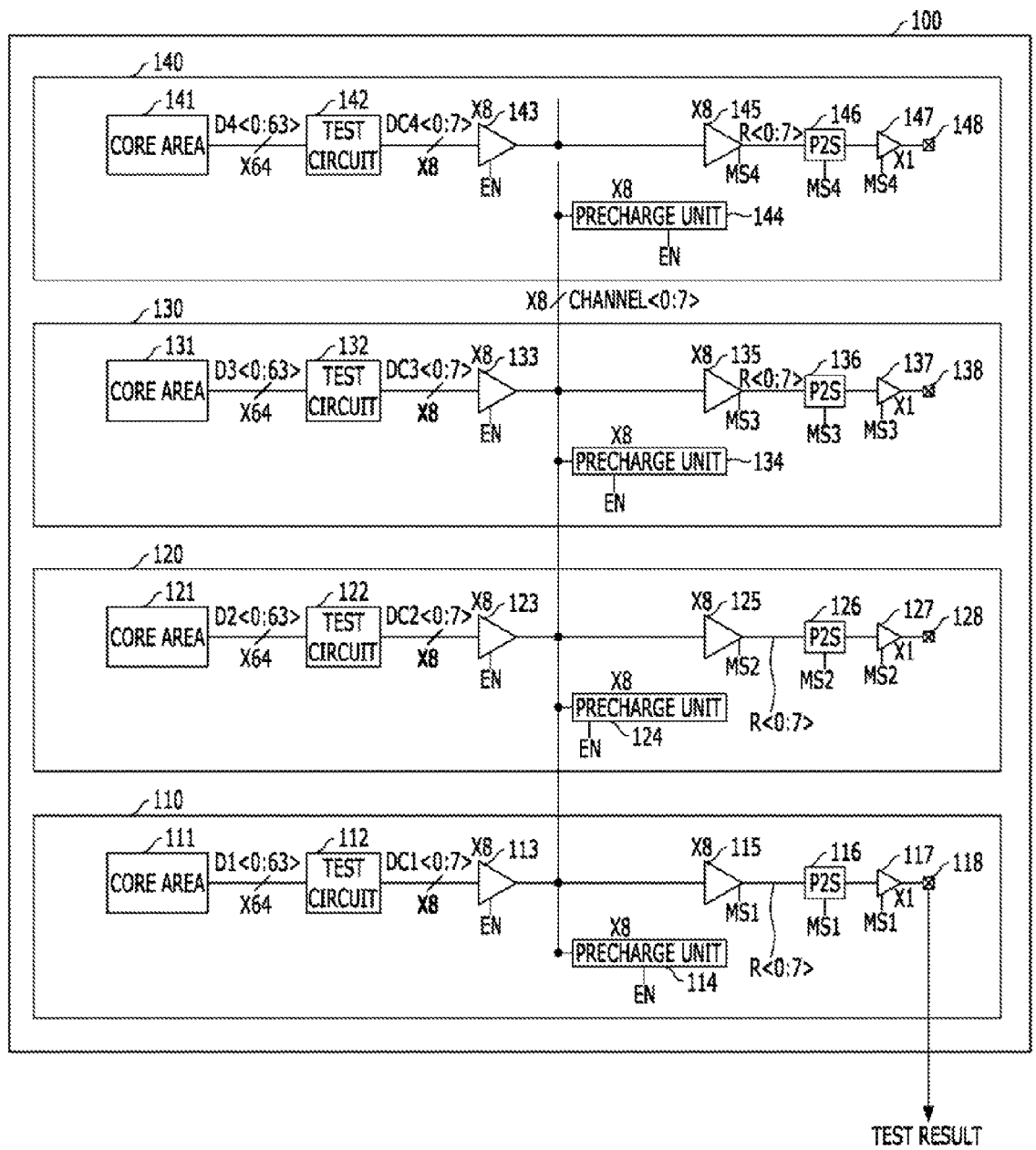
FIG. 1 is a block diagram of a multi-chip system in accordance with a first exemplary embodiment of the present invention.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

First Exemplary Embodiment

FIG. 1 is a block diagram of a mufti-chip system in accordance with a first exemplary embodiment of the present invention.

Referring to FIG. 1, the multi-chip system includes a plurality of memory chips 110, 120, 130, and 140 stacked in a semiconductor package 100 and interlayer channels CHANNEL<0:7> shared by the memory chips 110, 120, 130, and 140. The memory chips 110, 120, 130, and 140 include core areas 111, 121, 131, and 141, test circuits 112, 122, 132, and 142, transmitting units 113, 123, 133, and 143, and precharge units 114, 124, 134, and 144, receiving units 115, 125, 135, and 145, parallel-to-serial conversion units 116, 126, 136, and 146, drivers 117, 127, 137, and 147, and pads 118, 128, 138, and 148, respectively.

The core areas 111, 121, 131, and 141 serve to store data inside the memory chips 110, 120, 130, and 140. Each of the core areas 111, 121, 131, and 141 may include well-known components of a memory, for example, a cell array, a row decoder, a column decoder, a write driver, and a sense amplifier. During a compression (parallel) test, data having the same logic level are repetitively stored in the core areas. The operation of repetitively storing data at the same logic level in the core areas 111, 121, 131, and 141 may be performed by performing a plurality of write operations, copying stored data, or copying input data to write the same data to a plurality of areas. When a read command is applied during the compression (parallel) test, a plurality of data are read from the core areas 111, 121, 131, and 141 of the memory chips 110, 120, 130, and 140, respectively, at the same time. For example, 64-bit data may be read from each of the memory chips, that is, total 256-bit data may be read.

The test circuits 112, 122, 132, and 142 are configured to compress the data D1<0:63>, D2<0:63>, D3<0:63>, and D4<0:63> read from the core areas 111, 121, 131, and 141 and generate the compressed data DC1<0:7>, DC2<0:7>, DC3<0:7>, and DC4<0:7>, respectively. The test circuits 112, 122, 132, and 142 receive 64-bit data D1<0:63>, D2<0:63>, D3<0:63>, and D4<0:63>, compress the received data, and generate eight-bit compressed data DC1<0:7>, DC2<0:7>, DC3<0:7>, and DC4<0:7>, respectively. The compressed data DC1<0:7>, DC2<0:7>, DC3<0:7>, and DC4<0:7> have information indicating whether all of the data D1<0:63>, D2<0:63>, D3<0:63>, and D4<0:63> before compression have the same level or not. For example, the compressed data DC1<0> of the compressed data DC1<0:7> has a value of when eight data D1<0:7> have the same level, but otherwise has a value of '0'. Furthermore, the compressed data DC1<1> has a value of '1' when eight data D1<8:17> have the same level, but otherwise has a value of '0'. When the compressed data DC1<0> has a value of '1' it may indicate that there is no error in memory cells to store the eight data D1<0:7> in the core area 111, and when the compressed data DC1<1> has a value of '1' it may indicate that there is no error in memory cells to store the eight data DC1<8:15> in the core area 111. The test circuits 112, 122, 132, and 142 may include a plurality of XOR gates. FIG. 1 illustrates an example in which the test circuits 112, 122, 132, and 142 compress eight-bit data and generate one-bit compressed data, that is, data are compressed at a compression ratio of 8:1. However, the compression ratio may be changed depending on design.

The interlayer channels CHANNEL<0:7> serve to transmit the compressed data DC1<0:7>, DC2<0:7>, DC3<0:7>, and DC4<0:7> among the stacked memory chips 110, 120, 130, and 140. The interlayer channels CHANNEL<0:7> may be formed with through-silicon vias (TSVs). FIG. 1 illustrates an example in which the memory chips 110, 120, 130, and 140 generate the eight-bit compressed data DC1<0:7>, DC2<0:7>, DC3<0:7>, and DC4<0:7>, respectively. Thus, eight interlayer channels CHANNEL<0:7> are provided.

The precharge units 114, 124, 134, and 144 are configured to precharge the interlayer channels CHANNEL<0:7> to a first level, for example, '0'. The precharge units 114, 124, 134, and 144 precharge the interlayer channels CHANNEL<0:7> before the transmitting units 113, 123, 133, and 143 transmit the compressed data DC1<0:7>, DC2<0:7>, DC3<0:7>, and DC4<0:7> to the interlayer channels CHANNEL<0:7>. FIG. 1 illustrates an example in which eight interlayer channels CHANNEL<0:7> are provided. Thus, each of the memory chips 110, 120, 130, and 140 may include eight precharge units. The precharge units 114, 124, 134, and 144 precharge the interlayer channels CHANNEL<0:7> to the first level, for example, '0' while an enable signal EN is deactivated. Since the transmitting units 113, 123, 133, and 143 are enabled while the enable signal EN is activated, the precharge units 114, 124, 134, and 144 precharge the interlayer channels CHANNEL<0:7> before the operations of the transmitting units 113, 123, 133, and 143.

The transmitting units 113, 123, 133, and 143 are configured to transmit the compressed data DC1<0:7>, DC2<0:7>, DC3<0:7>, and DC4<0:7> to the interlayer channels CHANNEL<0:7>. The transmitting units 113, 123, 133, and 143 drive the interlayer channels CHANNEL<0:7> to a second level corresponding to the opposite level of the first level, for example, '1', when the compressed data DC1<0:7>, DC2<0:7>, DC3<0:7> and DC4<0:7> transmitted by the respective transmitting units indicate that there is an error, that is, have a value of '0'. Furthermore, the transmitting units 113, 123, 133, and 143 do not drive the interlayer channels CHANNEL<0:7> when the compressed data DC1<0:7>, DC2<0:7>, DC3<0:7>, and DC4<0:7> transmitted by the respective transmitting units 113, 123, 133, and 143 indicate that there is no error, that is, have a value of '1' As a result, the interlayer channel CHANNEL<0> has a level of '0' only when all of the compressed data D1<0>, D2<0>, D3<0>, and D4<0> have a value of and has a level of '1' when any one of the compressed data D1<0>, D2<0>, D3<0>, and D4<0> has a value of '0'. Similarly, the interlayer channel CHANNEL<1> has a level of '0' only when all of the compressed data D1<1>, D2<1>, D3<1>, and D4<1> have a value of '1', and has a level of '1' when any one of the compressed data D1<1>, D2<1>, D3<1>, and D4<1> has a value of '0'.

When the interlayer channel CHANNEL<0> of the interlayer channels CHANNEL<0:7> has a level of '0', it means that all of the compressed data DC1<1>, DC2<1>, DC3<1>, and DC4<1> generated by the memory chips 110, 120, 130, and 130 have a level of T. This indicates that memory cells to store the data D1<0:7>, D2<0:7>, D3<0:7>, and D4<0:7> in the core areas 111, 121, 131, and 141 of the memory chips 110, 120, 130, and 140 correspond to a pass. Similarly, when the interlayer channel CHANNEL<6> has a level of '0', it means that all of the compressed data DC1<6>, DC2<6>, DC3<6>, and DC4<6> generated by the memory chips 110, 120, 130, and 140 have a level of '1'. This indicates that memory cells to store the data D1<40:55>, D2<48:55>, D3<48:55>, and D4<48:55> in the core areas 111, 121, 131, and 141 of the memory chips 110, 120, 130, and 140 correspond to a pass. Furthermore, when the interlayer channel CHANNEL<1> has a level of '1', it means that one or more of the compressed data DC1<1>, DC2<1>, DC3<1>, and DC4<1> generated by the memory chips 110, 120, 130, and 140 have a level of '0'. This indicates that one or ore of memory cells to store the data D1<8:15>, D2<8:15>, D3<8:15>, and D4<8:15> in the core areas 111, 121, 131, and 141 of the memory chips 110, 120, 130, and 140 correspond to a fail.

The receiving units 115, 125, 135, and 145, the parallel-to-serial conversion units 116, 126, 136, and 146, and the drivers 117, 127, 137, and 147 are enabled only in the memory chip 110 set as a master among the memory chips 110, 120, 130, and 140, and disabled in the memory chips 120, 130, and 140 set as slaves. Among the memory chips 110, 120, 130, and 140 of the package 100, only one memory chip 110 is set as the master. Furthermore, each of signals MS1, MS2, MS3, and MS4 is activated when a corresponding chip is set as the master, and deactivated when the corresponding chip is set as a slave. In FIG. 1, the memory chip 110 is set as the master, and the other chips 120, 130, and 140 are set as slaves. Thus, only the signal MS1 of the signals MS1, MS2, MS3, and MS4 is activated. The memory chips 120, 130, and 140 set as slaves communicate with another device, for example, a memory controller or a test device, through the memory chip 110 set as the master. Although the pads 118, 128, 138, and 148 are provided for the respective memory chips 110, 120, 130, and 140, a line (conductor) for communicating with the outside of the package 100 is connected only to the pad 118 of the memory chip 110 set as the master.

The receiving units 115 of the memory chip 110 set as the master are configured to receive signals loaded in the interlayer channels CHANNEL<0:7> and transfer the received signals to the parallel-to-serial conversion unit 116. The number of receiving units 115 is set to be equal to the number of interlayer channels CHANNEL<0:7>. The parallel-to-serial conversion unit 116 is configured to parallel-to-serial convert the signals R<0:7> received from the receiving units 115. The parallel-to-serial conversion unit 116 performs the parallel-to-serial conversion such that the signals R<0:7> loaded in eight lines are loaded into one line. The parallel-to-serial conversion result of the parallel-to-serial conversion unit 116 is transferred to the driver 117, and the driver 117 outputs a test result to the outside through the pad 118. The receiving units 115, the parallel-to-serial conversion unit 116, and the driver 117 are enabled/disabled in response to the signal MS1.

As described above, the interlayer channels CHANNEL<0:7> shared by the memory chips 110 to 140 are precharged to the first level, a memory chip having a defect drives the interlayer channels CHANNEL<0:7> to the second level, and a memory chip having no defect does not drive the interlayer channels CHANNEL<0:7>. Thus, the multi-chip system 100 including the plurality of memory chips 110 to 140 stacked therein may perform the parallel test on all of the memory chips 110 to 140 at the same time.

FIG. 1 illustrates that the memory chips 110 to 140 are stacked in the multi-chip system package 100. The present invention is not limited only to the multi-chip system including the plurality of memory chips 110 to 140 stacked therein, but may be applied to a multi-chip system including different types of integrated circuit chips stacked therein. That is, the present invention may be applied to a case in which any types of integrated circuit chips are stacked in the multi-chip package, a test circuit exists in each of the integrated circuit chips, and a test result signal indicating whether there is an error or not is generated from the test circuit.

Figure 2:
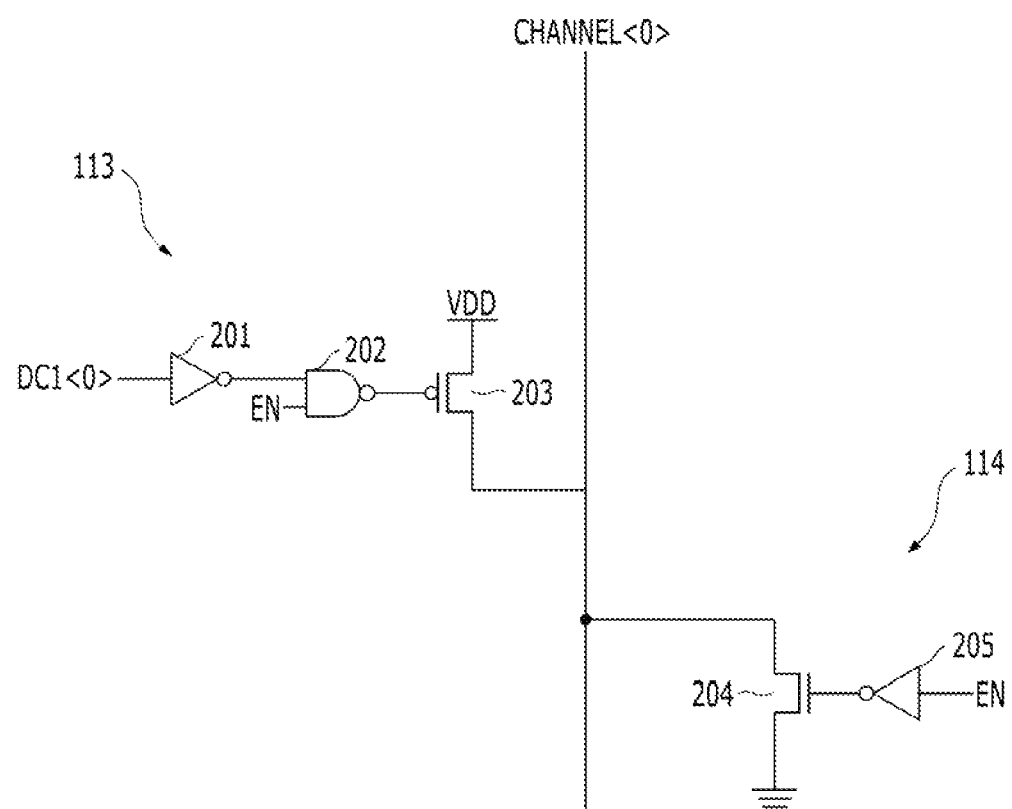
FIG. 2 is a circuit diagram of a transmitting unit and a precharge unit shown in FIG. 1.

FIG. 2 is a circuit diagram of the transmitting unit 113 and the to precharge unit 114 of FIG. 1, FIG. 2 illustrates the transmitting unit and the precharge unit to drive the interlayer channel CHANNEL<0> among the eight transmitting units 113 and the eight precharge units 114 of FIG. 1.

The transmitting unit 113 may include an inverter 201, NAND gate 202, and a PMOS transistor 203. The transmitting unit 113 drives the interlayer channel CHANNEL<0> to '1' when the compressed data DC1<0> has a level of '0' in a state where the enable signal EN is activated to '1'.

The precharge unit 114 may include an inverter 205 and an NMOS transistor 204. The precharge unit 114 precharges the interlayer channel CHANNEL<0> to a level of '0' when the enable signal EN is deactivated to '0'.

FIG. 2 illustrates that the precharge unit 114 precharges the interlayer channel CHANNEL<0> to a level of '0' and the transmitting unit 113 drives the interlayer channel CHANNEL<0> to a level of '1' when the compressed data DC1<0> indicates that there is an error. Depending on design, however, the precharge level of the precharge unit 114 may be set to '1', and the drive level of the transmitting unit 113 may be set to '0'.

In accordance with the first embodiment of the present invention, all of the memory chips 110, 120, 130, and 130 of the package 100 use the interlayer channels CHANNEL<0:7> at the same time. In a second embodiment of the present invention which will be described below, interlayer channels are distributed to memory chips of a package and then used.

Second Exemplary Embodiment

Figure 3:
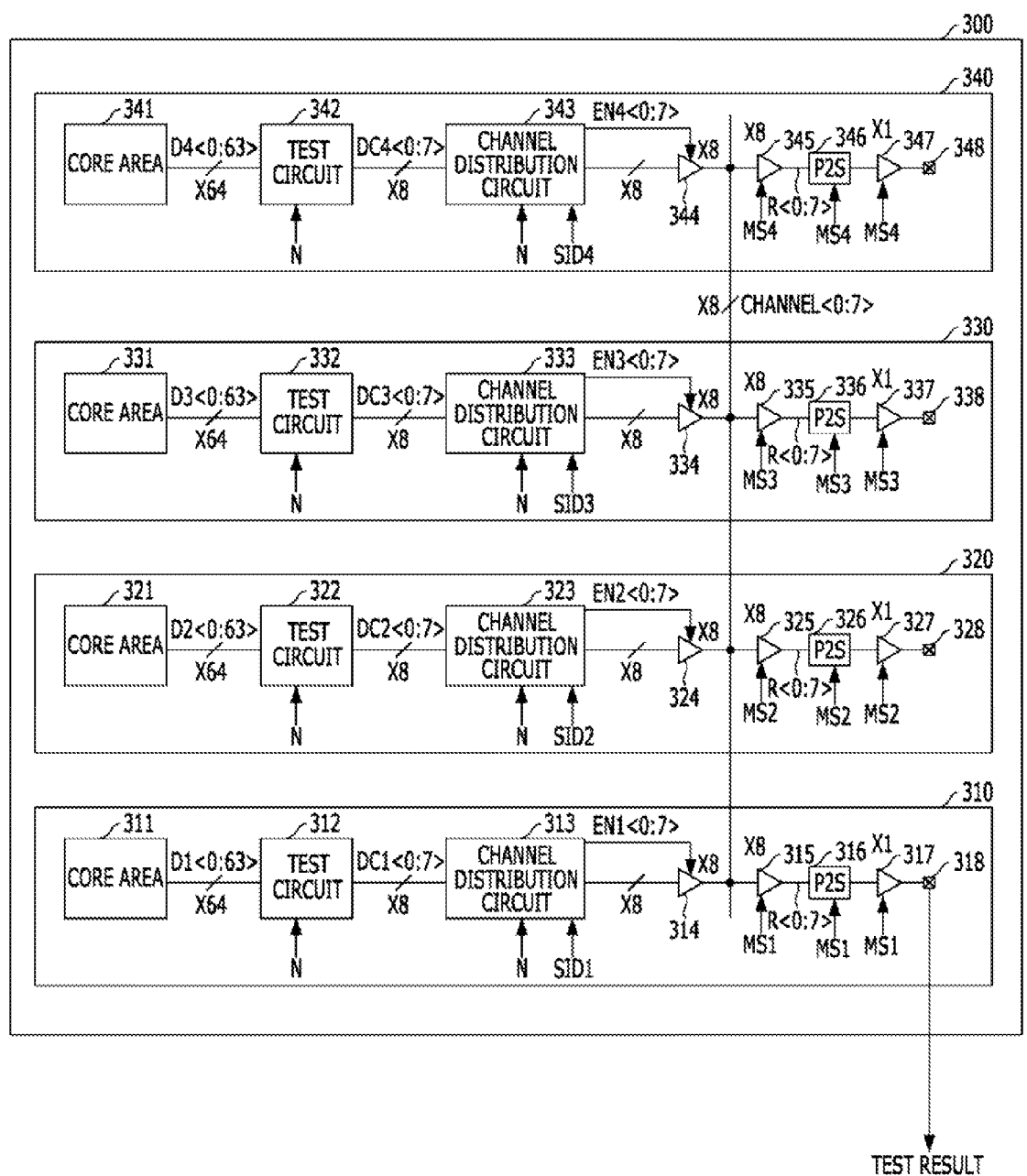
FIG. 3 is a block diagram illustrating a multi-chip system in accordance with a second exemplary embodiment of the present invention.

FIG. 3 is a block diagram illustrating a multi-chip system in accordance with a second exemplary embodiment of the present invention.

Referring to FIG. 3, the multi-chip system includes a plurality of memory chips 310, 320, 330, and 340 stacked in a semiconductor package 300 and interlayer channels CHANNEL<0:7> shared by the memory chips 310, 320, 330, and 340. The memory chips 310, 320, 330, and 340 include core areas 311, 321, 331, and 341, test circuits 312, 322, 332, and 342, channel distribution circuits 313, 323, 333, and 343, transmitting units 314, 324, 334, and 344, receiving units 315, 325, 335, and 345, parallel-to-serial conversion units 316, 326, 336, and 346, drivers 317, 327, 337, and 347, and pads 318, 328, 338, and 348, respectively.

The core areas 311, 321, 332, and 341 are configured to store data inside the respective memory chips 310, 320, 330, and 340. Each of the core areas 311, 321, 331, and 341 may include well-known components of a memory, such as a cell array, a row decoder, a column decoder, a write driver, a sense amplifier and the like. During a compression (parallel) test, data having the same logic level are repetitively stored in the core areas. The operation of repetitively storing data at the same logic level in the core areas 311, 321, 331, and 341 may be performed by performing a plurality of write operations, copying stored data, or copying input data to write the same data to a plurality of areas. When a read command is applied during the compression (parallel) test, a plurality of data are read from the core areas 311, 321, 331, and 341 of the memory chips 310, 320, 330, and 340, respectively, at the same time. For example, 64-bit data may be read from each of the memory chips, that is, total 256-bit data may be read.

The test circuits 312, 322, 332, and 342 are configured to compress the data D1<0:63>, D2<0:63>, D3<0:63>, and D4<0:63> read from the core areas 311, 321, 331, and 341 and generate the compressed data DC1<0:7>, DC2<0:7>, DC3<0:7>, and DC4<0:7>, respectively. The compressed data DC1<0:7>, DC2<0:7>, DC3<0:7>, and DC4<0:7> have information on whether all of the corresponding data D1<0:63>, D2<0:63>, D3<0:63>, and D4<0:63> have the same level or not. The compression rates of the test circuits 312, 322, 332, and 342 are changed according to chip number information N. The chip number information N indicates the number of memory chips 310, 320, 330, and 340 stacked in the package 300. As the chip number information N increases, the compression rate of the test circuits 312, 322, 332, and 342 may increase. Table 1 shows the compression rates based on the chip number information N and which data among the data D1<0:63>, D2<0:63>, D3<0:63>, and D4<0:63> are compressed to generate to the compressed data DC1<0:7>, DC2<0:7>, DC3<0:7>, and DC4<0:7>. In Table 1, X represents an integer ranging from 1 to 4.

TABLE 1

| N = 1 (8:1) | DCX<0> DX<0:7> | DCX<1> DX<8:15> | DCX<2> DX<16:23> | DCX<3> DX<24:31> | DCX<4> DX<32:39> | DCX<5> DX<40:47> | DCX<6> DX<48:55> | DCX<7> DX<56:63> |
|---|---|---|---|---|---|---|---|---|
| N = 2 (16:1) | DCX<0> DX<0:15> | DCX<1> DX<16:31> | DCX<2> DX<32:47> | DCX<3> DX<48:63> | DCX<4> Invalid | DCX<5> Invalid | DCX<6> Invalid | DCX<7> Invalid |
| N = 4 (32:1) | DCX<0> DX<0:31> | DCX<1> DX<32:63> | DCX<2> Invalid | DCX<3> Invalid | DCX<4> Invalid | DCX<5> Invalid | DCX<6> Invalid | DCX<7> Invalid |

Referring to Table 1, it can be seen that when the chip number N is 1, the compression rate is set to 8:1, the compressed data DCX<3> is generated by compressing eight data DX<24:31>, and the compressed data DCX<7> is generated by compressing eight data DX<56:63>. Furthermore, when the chip number N is 1, no invalid signals exist among the compressed data DCX<0:7>.

Furthermore, it may be seen that when the chip number N is 2, the compression rate is set to 16:1, the compressed data DCX<0> is generated by compressing 16-bit data DX<0:15>, and the compressed data DCX<2> is generated by compressing 16-bit data DX<32:47>. When the compression rate is set to 16:1 because the chip number N is 2, 64-bit data DX<0:63> may be compressed into four-bit data DCX<0:3>. Thus, the compressed data DCX<4:7> correspond to invalid data, that is, the compressed data DCX<4:7> have no information and are not used.

When the chip number N is 4, the compression rate is set to 32:1, the compressed data DCX<0> is generated by compressing 32-bit data DX<0:31>, and the compressed data DCX<1> is generated by compressing 32-bit data DX<32:63>. When the compression rate is set to 32:1 because the chip number N is 4, 64-bit data DX<0:63> may be compressed into two data DCX<0:1>. Thus, the compressed data DCX<2:7> correspond to invalid data.

The reason why the compression rates of the test circuits 312, 322, 332, and 342 are changed is that the number of interlayer channels available for the respective memory chips 310, 320, 330, and 340 is changed according to the number N of stacked chips. That is, the compression rates of the test circuits 312, 322, 332, and 342 are set in such a manner that the bit number of valid compressed data among the compressed data DCX<0:7> corresponds to [number of interlayer channels (eight)]/[chip number N].

The channel distribution circuits 313, 323, 333, and 343 are configured to distribute the interlayer channels CHANNEL<0:7> through which the compressed data DC1<0:7>, DC2<0:7>, DC3<0:7>, and DC4<0:7> generated by the test circuits 312, 322, 332, and 342 are to be transmitted in response to the chip number information N and slice IDs SID1, SID2, SID3, and SID4. The channel distribution circuits 313, 323, 333, and 343 distribute the interlayer channels CHANNEL<0:7> such that the interlayer channels used by the memory chips 310, 320, 330, and 340 do not overlap each other. The slice IDs SID1, SID2, SID3, and SID4 serve to identify the stacked memory chips 310, 320, 330, and 340 from each other, and have different values. For example, the slice ID SID1 of the first memory chip 310 has a value of 1, and the slice ID SID2 of the second memory chip 320 has a value of 2. The channel distribution circuits 313, 323, 333, and 343 transfer the compressed data DC1<0:7>, DC2<0:7>, DC3<0:7>, and DC4<0:7> generated by the test circuits 312, 322, 332, and 342 to distributed channels among the interlayer channels CHANNEL<0:7>, and enable transmitting units for driving the distributed channels among the transmitting units 314, 324, 334, and 344, using enable signals EN1<0:7>, EN2<0:7>, EN3<0:7>, and EN4<0:7>.

Table 2 shows the corresponding relation between the compressed data DC1<0:7> and the interlayer channels CHANNEL<0:7> based on the chip number N and the slice ID SIX.

TABLE 2

| Chip number N | Slice ID SIDX | Compressed data and channel corresponding to each other, and activated signal |
|---|---|---|
| 1 | Don't care | DCX<0>->CHANNEL<0>, EN<0> activated |
| | | DCX<1>->CHANNEL<1>, EN<1> activated |
| | | DCX<2>->CHANNEL<2>, EN<2> activated |
| | | DCX<3>->CHANNEL<3>, EN<3> activated |
| | | DCX<4>->CHANNEL<4>, EN<4> activated |
| | | DCX<5>->CHANNEL<5>, EN<5> activated |
| | | DCX<6>->CHANNEL<6>, EN<6> activated |
| | | DCX<7>->CHANNEL<7>, EN<7> activated |
| 2 | 1 | DCX<0>->CHANNEL<0>, EN<0> activated |
| | | DCX<1>->CHANNEL<1>, EN<1> activated |
| | | DCX<2>->CHANNEL<2>, EN<2> activated |
| | | DCX<3>->CHANNEL<3>, EN<3> activated |
| | 2 | DCX<0>->CHANNEL<4>, EN<4> activated |
| | | DCX<1>->CHANNEL<5>, EN<5> activated |
| | | DCX<2>->CHANNEL<6>, EN<6> activated |
| | | DCX<3>->CHANNEL<7>, EN<7> activated |
| 4 | 1 | DCX<0>->CHANNEL<0>, EN<0> activated |
| | | DCX<1>->CHANNEL<1>, EN<1> activated |
| | 2 | DCX<0>->CHANNEL<2>, EN<2> activated |
| | | DCX<1>->CHANNEL<3>, EN<3> activated |
| | 3 | DCX<0>->CHANNEL<4>, EN<4> activated |
| | | DCX<1>->CHANNEL<5>, EN<5> activated |
| | 4 | DCX<0>->CHANNEL<6>, EN<6> activated |
| | | DCX<1>->CHANNEL<7>, EN<7> activated |

The transmitting units 314, 324, 334, and 344 are configured to transmit the compressed data DC1<0:7>, DC2<0:7>, DC3<0:7>, and DC4<0:7> received from the channel distribution circuits 313, 323, 333, and 343 to the interlayer channels CHANNEL<0:7>. The transmitting units 314, 324, 334, and 344 drive the interlayer channels CHANNEL<0:7> to '1' when the compressed data DC1<0:7>, DC2<0:7>, DC3<0:7>, and DC4<0:7> have a value of '1', and drive the interlayer channels CHANNEL<0:7> to '0' when the compressed data DC1<0:7>, DC2<0:7>, DC3<0:7>, and DC4<0:7> have a value of '0'. The transmitting units 314, 324, 334, and 344 are enabled in response to the enable signals EN1<0:7>, EN2<0:7>, EN3<0:7>, and EN4<0:7>. Since the interlayer channels CHANNEL<0:7> are distributed to the memory chips 310, 320, 330, and 340 by the channel distribution circuits 313, 323, 333, and 343, the memory chips 310, 320, 330, and 340 do not drive the same interlayer channels CHANNEL<0:7>. For example, when the transmitting unit to drive the interlayer channel CHANNEL<1> among the eight transmitting units 314 of the memory chip 310 is enabled, the transmitting units to drive the interlayer channel CHANNEL<1> among the transmitting units 324, 334, and 344 of the other memory chips 320, 330, and 340 are disabled. That is, when the enable signal EN1<1> is activated in the memory chip 310, the enable signals EN2<1>, EN3<1>, and EN4<1> are deactivated in the memory chips 320, 330, and 340

The receiving units 315, 325, 335, and 345, the parallel-to-serial conversion units 316, 326, 336, and 346, and the drivers 317, 327, 337, and 347 are enabled only in the memory chip 310 set as the master among the memory chips 310, 320, 330, and 340, and are disabled in the memory chips 320, 330, and 340 set as slaves. Among the memory chips 310, 320, 330, and 340 of the package 300, only one memory chip 310 is set as the master. Each of the signals MS1, MS2, MS3, and MS4 is activated when the corresponding chip is set as the master, and deactivated when the corresponding chip is set as a slave. In FIG. 3, only the memory chip 310 is set as the master, and the other chips 320, 330, and 340 are set as slaves. Thus, only the signal MS1 of the signals MS1, MS2, MS3, and MS4 is activated. The memory chips 320, 330, and 340 set as slaves communicate with another device, for example, a memory controller or a test device, through the memory chip 310 set as the master. The pads 318, 328, 338, and 348 are provided for all of the memory chips 310, 320, 330, and 340, but, a line (conductor) for communicating with the outside of the package 300 is connected only to the pad 318 of the memory chip 310 set as the master.

The receiving units 315 of the memory chip 310 set as the master are configured to receive signals loaded in the interlayer channels CHANNEL<0:7> and transfer the received signals to the parallel-to-serial conversion unit 316. The number of receiving units 315 is set to be equal to the number of interlayer channels CHANNEL<0:7>. The parallel-to-serial conversion unit 316 is configured to parallel-to-serial convert the signals R<0:7> received from the receiving units 315. The parallel-to-serial conversion unit 316 performs parallel-to-serial conversion such that the signals R<0:7> loaded in eight lines are loaded into one line. The parallel-to-serial conversion result of the parallel-to-serial conversion unit 316 is transferred to the driver 317, and the driver 317 outputs a test result to the outside through the pad 318. The receiving units 315, the parallel-to-serial conversion unit 316, and the driver 317 are enabled/disabled in response to the signal MS1.

Figure 4A:
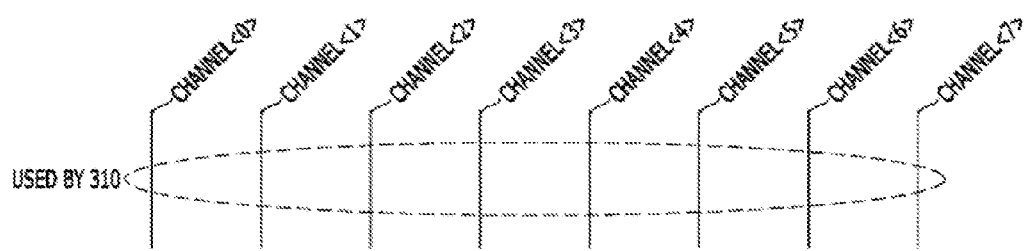
FIG. 4A is a diagram illustrating interlayer channels used by a one memory chip included in a package.
Figure 4B:
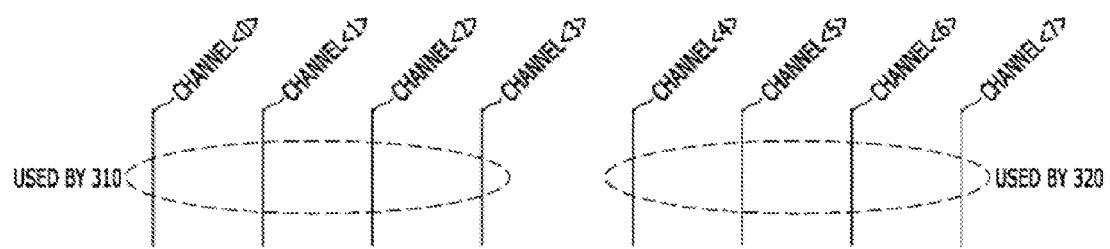
FIG. 4B is a diagram illustrating interlayer channels used by two memory chips, which are stacked in the package.
Figure 4C:
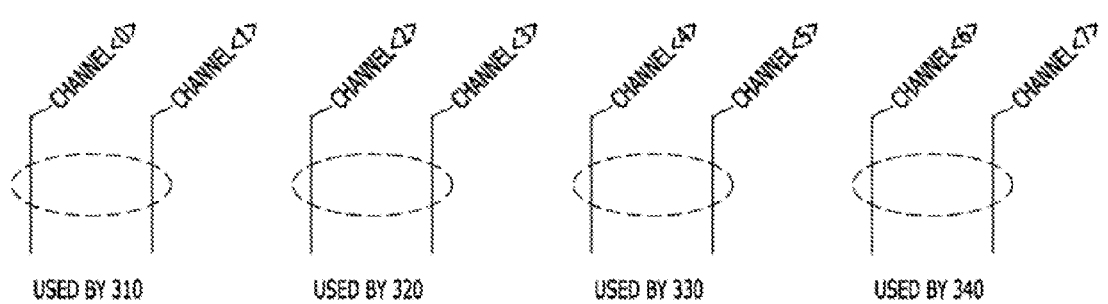
FIG. 4C is a diagram illustrating interlayer channels used by four memory chips, which are stacked in the package.

FIG. 4A illustrates interlayer channels CHANNEL<0:7> used by a one memory chip 310 included in the package 300, FIG. 4B illustrates interlayer channels CHANNEL<0:7> used by two memory chips 310 and 320, which are stacked in the package 300, and FIG. 4C illustrates interlayer channels CHANNEL<0:7> used by four memory chips 310, 320, 330, and 340, which are stacked in the package 300.

Referring to FIG. 4A, when one memory chip 310 exists in the package 300, the memory chip 310 uses the entire interlayer channels CHANNEL<0:7>. In this case, all of the transmitting units 314 of the memory chip 310 are enabled, that is, the enable signals EN1<0:7> are activated to transmit the compressed data DC1<0:7> to the interlayer channels CHANNEL<0:7>. Then, the compressed data loaded in the interlayer channels CHANNEL<0:7> are received by the receiving units 315, and outputted as a test result to the outside of the package 300 through the parallel-to-serial conversion unit 316, the driver 317, and the pad 318.

Referring to FIG. 4B, when two memory chips 310 and 320 are stacked in the package 300, the memory chip 310 uses the interlayer channels CHANNEL<0:3>, and the memory chip 320 uses the interlayer channels CHANNEL<4:7>. That is, the enable signals EN1<0:3> are activated in the memory chip 310, and the enable signals EN2<4:7> are activated in the memory chip 320. The compressed data of the memory chips 310 and 320, transmitted to the interlayer channels CHANNEL<0:7>, are received by the receiving units 315 of the memory chip 310 set as the master, and outputted as a test result to the outside of the package 300 through the parallel-to-serial conversion unit 316, the driver 317, and the pad 318.

Referring to FIG. 4C, when four memory chips 310, 320, 330, and 340 are stacked in the package 300, the memory chip 310 uses the interlayer channels CHANNEL<0:1>, the memory chip 320 uses the interlayer channels CHANNEL<2:3>, the memory chip 330 uses the interlayer channels CHANNEL<4:5>, and the memory chip 340 uses the interlayer channels CHANNEL<6:7>. That is, the enable signal's EN1<0:1> are activated in the memory chip 310, the enable signals EN2<2:3> are activated in the memory chip 320, the enable signals EN3<4:5> are activated in the memory chip 330, and the enable signals EN4<6:7> are activated in the memory chip 340. The compressed data of the memory chips 310, 320, 330, and 340, transmitted to the interlayer channels CHANNEL<0:7>, are received by the receiving units 315 of the memory chip 310 set as the master, and then outputted as a test result to the outside of the package 300 through the parallel-to-serial conversion unit 316, the driver 317, and the pad 318.

In accordance with the second embodiment of the present invention, the compression rates of the test circuits of the memory chips are changed according to the number of memory chips stacked in the package 300, and the interlayer channels CHANNEL<0:7> are distributed to the memory chips according to the number of chips and the slice IDs. Thus, the parallel test may be performed on the package including the plurality of memory chips stacked therein. In the first embodiment of the present invention, all of the memory chips of the package use all of the interlayer channels at the same time. In the second embodiment of the present invention, however, the interlayer channels are properly distributed to the memory chips of the package.

In accordance with the embodiments of the present invention, it is possible to easily perform a test for a multi-chip system including a plurality of integrated circuit chips or memory chips.

Although various embodiments have been described for illustrative purposes, it will be apparent to those skilled in the art that various changes and modifications may be made without departing from the spirit and scope of the invention as defined in the following claims.

In particular the number of memory chips, the number of interlayer channels, and the bit numbers of the respective signals may be changed depending on design.

What is claimed is:

1. A multi-chip system comprising:
a plurality of memory chips; and
a plurality of interlayer channels,
wherein each of the memory chips comprises:

a test circuit suitable for compressing multi-bit read data to generate one-bit or more compressed data, receiving information indicating the number of memory chips, and changing a compression rate thereof according to the number of memory chips; and a channel distribution circuit suitable for distributing an interlayer channel, through which the compressed data of the test circuit is to be transferred, among the plurality of interlayer channels.

2. The multi-chip system of claim 1, wherein the channel distribution circuits of the respective memory chips distribute different interlayer channels to the memory chips, using slice IDs for distinguishing the memory chips from each other.

3. The multi-chip system of claim 1, wherein each of the test circuits of the respective memory chips has a compression rate which is determined as:

the compression rate=(the number of interlayer channels)/(the number of memory chips).

4. The multi-chip system of claim 1, wherein one of the memory chips is set as a master, the other chips are set as slaves, and the memory chip set as the master receives the compressed data loaded in the plurality of interlayer channels and outputs the received data to the outside of the multi-chip system.

5. The multi-chip system of claim 1, wherein the memory chips are stacked in one semiconductor package.

* * * * *